United States Patent
Haase

(10) Patent No.: US 7,388,375 B2
(45) Date of Patent: Jun. 17, 2008

(54) METHOD AND APPARATUS FOR MAGNETIC RESONANCE SPECTROSCOPY

(75) Inventor: Jürgen Haase, Schorndorf (DE)

(73) Assignee: Max-Planck-Gesellschaft Zur Foerderung Der Wissenschaften E.V., Munich (DE)

( * ) Notice: Subject to any disclaimer, the term of this patent is extended or adjusted under 35 U.S.C. 154(b) by 940 days.

(21) Appl. No.: 10/733,644

(22) Filed: Dec. 12, 2003

(65) Prior Publication Data

US 2007/0273374 A1    Nov. 29, 2007

(51) Int. Cl.
*G01V 3/00*    (2006.01)
(52) U.S. Cl. .................. 324/307; 324/300; 324/318
(58) Field of Classification Search ........... 324/307, 324/309, 318, 313, 300
See application file for complete search history.

(56) References Cited

U.S. PATENT DOCUMENTS

| | | | | |
|---|---|---|---|---|
| 3,774,103 A | * | 11/1973 | Laukien | 324/313 |
| 4,521,734 A | * | 6/1985 | Macovski | 324/313 |
| 5,057,776 A | * | 10/1991 | Macovski | 324/309 |

* cited by examiner

*Primary Examiner*—Louis M Arana
(74) *Attorney, Agent, or Firm*—Dennison, Schultz & MacDonald

(57) ABSTRACT

In the method disclosed here for magnetic resonance spectroscopy, the main magnetic field in the sample measurement region is generated in the form of a pulse, and the excitation and detection of the magnetic resonance is performed close to the pulse maximum within a defined time window in which the amplitude of the main field follows a defined time function. Subject matter of the invention is moreover an apparatus for performing such a method and a sample head which is especially suitable for the described method.

32 Claims, 5 Drawing Sheets

METHOD AND APPARATUS FOR MAGNETIC RESONANCE SPECTROSCOPY

The invention relates to a method and an apparatus for spectroscopic examination of a sample on the basis of magnetic resonance (MR). A preferred area of application of the invention is spectroscopy by observing nuclear magnetic resonance (NMR).

Nuclear magnetic resonance is one of the important physical methods of examining the structures of molecules up to macroscopic objects. In known methods for NMR-spectroscopy the materials (samples) to be examined are introduced into a static magnetic field, referred to below as the "main field", which polarises the nuclei of the various atoms along the field. In other words, the "spins" of the nuclei of the atoms are aligned with respect to their axis of spin longitudinally with respect to the direction "z" of the main field. In simple experiments the "longitudinal" magnetisation of a specific type of nucleus created in this manner is usually tilted, by means of a short electromagnetic high frequency pulse (HF-excitation pulse), by a so-called "flip angle" which depends upon the amount of the influencing HF-energy. As a consequence of the resulting precession of the spins the magnetisation rotates about the axis of the static magnetic field so that a Mxy component described as "transverse" magnetisation is produced, which rotates in an "xy plane" which lies orthogonal with respect to the z-direction. The ratio of this rotational frequency to the magnetic field strength at the location of the nucleus, the "gyromagnetic ratio" γ, is a natural constant specific to the nucleus. This effect can be demonstrated by the voltage induced in a sample coil which encompasses the material to be examined. This voltage is mainly a mixture of various frequencies, which are determined by the strength of the magnetic field and the types of excited nuclei, and gradually dies away owing to diverse relaxation phenomena (decay of the excitation and dephasing of the spins). Valuable information relating to the structure can be derived from the time function of this voltage, the "NMR signal":

(1) The maximum amplitude of this voltage, the "intensity of the NMR signal", is proportional to the number of the resonant atomic nuclei (it is also determined by the applied field, as the nuclear polarisation and the rotational frequency increase with the field strength, as does the voltage induced in the coil).

(2) The frequencies of the signal, which can be determined all the more precisely, the longer a signal is available, depend precisely linearly upon the "local" magnetic field which is sensed by the nuclei. This local field deviates typically from the externally applied field owing to the electronic environment of the nuclei (so-called "NMR displacement or shift"), from which it is possible to derive information relating to the structure.

(3) The decay of the signal contains information regarding the time-dependent local fields.

It is already possible to derive from the three mentioned essential characteristics of the NMR signal, that the main magnetic field must be known exactly in order to be able to obtain reliable information relating to the structure. It is also evident that a strong field produces a large signal and thus enhances sensitivity of the method. In addition to this, the differences in frequency between nuclei having similar electronic environment increase with the field. This causes the desired increased resolution obtained in high magnetic fields.

As already indicated in Item (2), the electronic environment of the atomic nuclei changes the magnetic field actually detected by the nuclei. In many cases, the magnetic field influences the electronic characteristics only slightly, so that the observed shifting effects are proportional to the field. In extremely high fields, this is no longer the case and sudden, drastic changes in the electronic state can occur. The possibility then arises to study the electronic characteristics of materials as a function of the field. This branch of high field physics has developed tremendously over the years with modern materials' science. Novel electronic states could be analysed which determine the material characteristics in the field and lead to interesting applications.

It is obvious from the above that high, static magnetic fields are advantageous. In actual fact, NMR applications have in the past profited from the development of static magnets with high fields originally, copper coils with iron yokes were used to generate the main field. The maximum field strengths achievable therewith were limited to a few Tesla (T). Moreover, the necessary temperature control of large iron masses is problematic. This also applies to the same extent to permanent magnets and as a consequence also limits the alternative use of such magnets for generating the main field. Superconductive magnets which gradually replaced the normally conductive coils with yokes use simple air core coils made from superconductive wire which allows large currents to flow practically without loss over many years. As a consequence, strong, stable static magnetic fields could be produced. The disadvantage of these magnets is, that in order for superconductivity to occur they must be kept continuously at sufficiently low temperatures using helium (and nitrogen). The necessary cooling power is essentially determined by the passage of heat from the outside of the magnet inwards and not by the development of heat in the magnet itself. Although great progress in the construction of cryostats nowadays keeps the losses to a minimum, the costs in particular for helium and the problems in handling deep-chilled liquids are considerable.

Owing to the technological improvements during the last 40 years, it has been possible to increase constantly the maximum field strengths which can be achieved with superconductive magnetic coils. However, it is now clear that with approx. 20 T a limit has been achieved which cannot be overcome. There are currently no prospective superconductive materials which allow the magnetic field to be increased essentially beyond their limit (in principle, magnetic fields act against the superconductivity so that it eventually collapses). For this reason, resistive magnetic coils have increasingly regained favour in recent years. They are based on normally conductive wire and are therefore not restricted by this limit. However, resistive magnets have other crucial disadvantages which eventually necessitated the introduction of superconductive magnets. The most important disadvantage is caused by the electrical losses which occur. They lead to the coil heating up which must therefore be constantly cooled. This renders the magnets among other things quite voluminous which as a consequence requires even greater energies and thus in turn the losses increase (the field energy is proportional to the volume of the magnet and to the square of the field strength; in the case of the energy being predetermined the field strength thus drops if the volume is increased.)

Equally important aspects for the construction of static magnets are the mechanical strength, the conductivity and the specific heat of the coil material. It appears that with typical designs (Bitter magnets) the maximum achievable field strength of approx. 33 T cannot be exceeded. If a superconductive magnetic coil is combined with a resistive magnetic coil, the maximum field strength can be increased once again by approx. 10 T (the resistive coil is located in the superconductive coil, so that the critical field strength of the latter is not exceeded). Such systems are extremely expensive to acquire and the resistive coils require in addition high costs for maintenance (energy consumption, cooling water consumption).

It is an object of the present invention to provide a method for magnetic resonance spectroscopy wherein main magnetic fields with high field strengths can be used and which nevertheless can be realised with an inexpensive and spatially compact apparatus. A further object of the invention is to provide an apparatus for performing such a method.

In accordance with the invention a method for examining a sample by means of magnetic resonance spectroscopy is characterised by the performance of a utilization experiment comprising the following steps:

- a substantially homogenous main magnetic field is generated in a measurement region, which contains the volume of the sample, using a main field coil which encompasses the measurement region, the main field aligns the atomic spins of the sample longitudinally with respect to the field lines and has an amplitude progression in the form of at least one pulse which follows a defined time function within a defined time window;
- from a point in time prior to or at the commencement of the defined time window the sample is exposed to a high frequency electromagnetic excitation pulse, whose frequency band, amplitude and duration are selected such that within the time window a magnetic resonance signal appears;
- the temporal progression of the magnetic resonance signal is measured and its spectrum is analysed.

In the method in accordance with the invention, a normally conductive (i.e. resistive) coil can be used to generate an extremely high field strength of the main field. As the extent to which the coil is heated can be extremely low over time in the case of a pulsed operation, the same applies for the heat produced. This heat then does not have to be dissipated necessarily during the field pulse. As a consequence, it is possible to work with extremely small coils, which achieve high magnetic fields even where the energy is low. The shorter the pulse duration, the greater can the maximum field strength be (nowadays several hundred Tesla are achieved during a microsecond). The fields are limited by the mechanical strength of the coil and the heating process which still occurs. Naturally the desired duration of the field pulse is also determined by the desired experiments.

An apparatus in accordance with the invention for examining a sample by means of magnetic resonance spectroscopy comprises:

- a main field coil for generating in a measurement region a main magnetic field which is substantially homogenous;
- a sample holder for holding the sample in the measurement region;
- a current pulse generator for operating the main field coil by a current pulse in order to generate in the measurement region at least one main field pulse which can align the atomic spins of the sample being held longitudinally with respect to the field lines and which follows a defined time function within a defined time window;
- a sample coil which encompasses the location of the sample;
- an HF-generator for influencing the sample coil with an electromagnetic HF oscillating pulse whose frequency band, amplitude and duration can be adjusted such that within the defined time window a magnetic resonance signal from the sample is induced in the sample coil;
- a detection device for detecting the induced magnetic resonance signal;
- a control device which can be programmed to trigger the current pulse, the HF pulse and to connect the detection device to the sample coil for the duration of the defined time window.

A further aspect of the invention is a sample head which is adapted for use with the method in accordance with the invention or in the apparatus in accordance with the invention, in that it contains the sample coil which is mechanically connected rigidly to a vessel for receiving the sample and is mechanically connected rigidly to an electrical connector for connection to an HF supply line.

It is known per se to generate strong magnetic fields for examining materials by means of the pulsed operation of field coils. The development of such systems has been pushed forward in the last 10 years and fields up to 80 T are now achieved with a pulse duration of approx. 5 to 100 ms. However, corresponding systems have hitherto only been used to examine the conductivity and magnetisation of materials. A use of pulsed magnetic fields for magnetic resonance spectroscopy has hitherto not been suggested.

The principle of the invention and advantageous embodiments of the invention are explained in more detail hereinunder with reference to the drawings.

Figure 1:
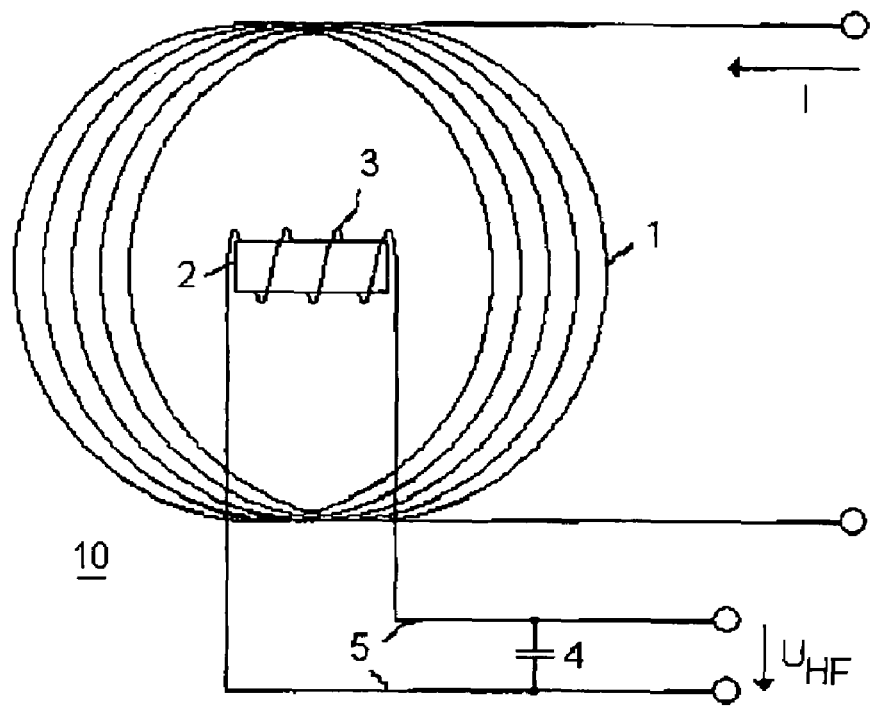
FIG. 1 illustrates schematically a measuring station for NMR-spectroscopy.

The measuring station 10 illustrated in FIG. 1 comprises a coil 1 which consists of resistively conductive material (e.g. copper) and when charged with a coil current I generates a magnetic field. A region exists inside the coil where the magnetic field generated is maximum and homogenous. The field within this region is referred to as the main field with the "main field strength" $B_0$ which is a monotonic function of I. The field lines of the main field extend in a spatial direction "z" in parallel with the axis of the main field coil 1.

The sample 2 to be examined is held by means of a suitable holder (not illustrated in FIG. 1) within the region of the homogenous main field strength $B_0$ and in fact in the effective region of a sample coil 3. This region is described here as the "measurement region". For the purpose of performing the examination an experiment is started in which a pulse of a high frequency voltage $U_{HF}$ is applied to the sample coil 3. The centre frequency and the bandwidth of this pulse are selected such that the spins of the particular chemical element (nucleus type or spin type) in the sample, the presence of which is to be analysed, are excited to NMR. The centre frequency $f_c$ is preferably set to the value:

$$f_c = \gamma_s * B_0$$

wherein $\gamma_s$ represents the gyromagnetic ratio of the chemical element to be analysed (the symbol * stands for multiplication). The bandwidth is set such that even such spins of this element whose NMR is shifted as a result of molecular bonds are excited.

At the end of the HF excitation pulse the voltage is measured which is induced in the sample coil 3 by the decay of the excitation. This voltage consists of a voltage signal with an exponentially decaying envelope curve, the so-called FID (Free Induction Decay) signal. The FID signal is detected and subjected to a Fourier transformation in order to analyse its spectral composition.

Accordingly, the sample coil 3 forms a transmit-receive antenna for electromagnetic HF oscillations. In order to optimise the level of efficiency this antenna must be tuned to $f_c$. In other words, the inductivity $L_M$ of the sample coil 3 including its supply lines and the capacity $C_M$ which is composed of the stray capacitance of the sample coil 3 and the capacities of the supply lines should fulfil the condition:

$$\frac{1}{\sqrt{L_M * C_M}} = 2\pi f_C. \qquad \text{Eq. (1)}$$

In FIG. 1, the capacity $C_M$ is symbolised by the capacitor 4.

Figure 2:
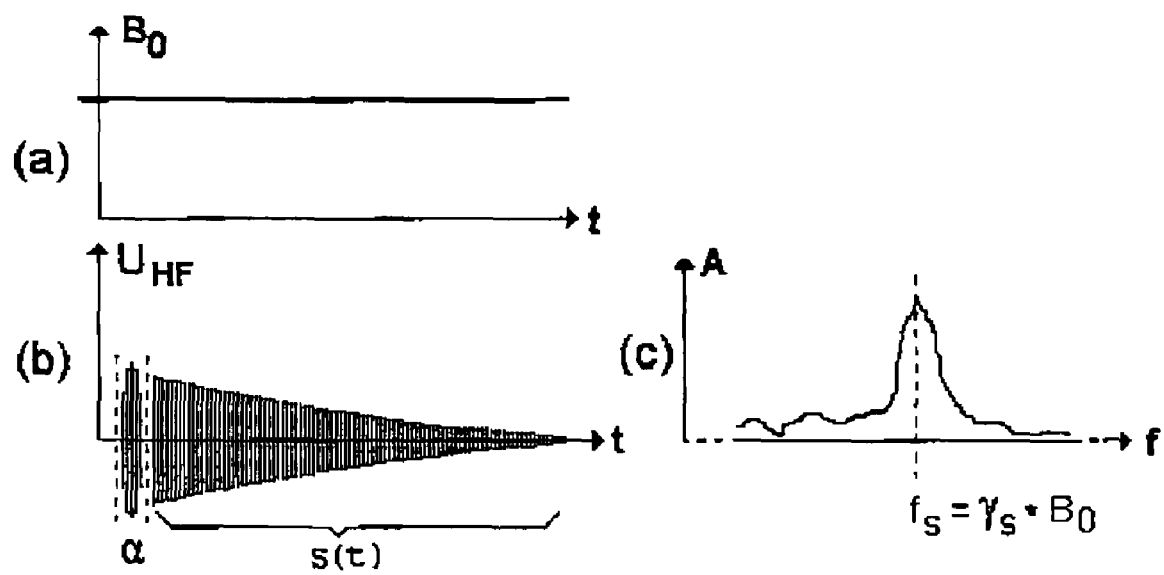
FIG. 2 illustrates diagrams of functions where the measuring station is operated in accordance with the prior art.

FIG. 2 illustrates the operation of the measuring station 10 according to the conventional methods of NMR spectroscopy. In this case a current I constant over time is applied to the main field coil 1, so that the main field has a field strength $B_0$ which is constant over time in the measurement region, as illustrated in the diagram (a) shown in FIG. 2. After the sample coil 3 has been operated by an HF excitation pulse which has the centre frequency $$f_C = f_S = \gamma_s * B_0 \qquad \text{Eq. (2)}$$

and preferably has a flip angle $\alpha$ of 90°, the FID signal S(t) appears, according to the time diagram (b) in FIG. 2. The spectrum of the FID signal obtained by means of the Fourier transformation, illustrated in diagram (c) of FIG. 2, has a pronounced "peak" close to or at the frequency $f_s$, if the sample 2 contains a noticeable proportion of the nucleus type whose gyromagnetic ratio is equal to $\gamma_s$. The area of this peak (integral of the amplitude over the frequency) provides information regarding the quantity of this nucleus type in the sample, and the precise position of the peak on the frequency axis can provide information regarding the shift effects, such as, for example, of the chemical shift.

In practice, the FID signal S(t), insofar as it is in a high frequency band, is preferably converted into a lower frequency band prior to the Fourier transformation being performed. This occurs by mixing with a carrier wave of a suitable frequency F and band pass filtering of the lower side band of the product of the mixture. Such a conversion is advantageous because then the demands are less on the scanning rate when detecting the NMR signal and on the operating rate of the Fourier transformation calculator. The frequency axis of the spectral function obtained in this manner is then scaled to F-f.

As described above, the present invention is characterised in that the main magnetic field $B_0$ is not generated with a constant field strength but in the form of a volatile pulse whose amplitude can rise far above the level of the hitherto achievable maximum constant field strengths (approx. 20 T). The main field pulse is preferably generated for a short period of time so that despite a high amplitude of, for example, 60 T, the energy necessary to operate the pulsed resistive main field coil is relatively less over time (far less than 5 kW) and can be stored in a suitable form prior to each pulse generation. The power necessary to generate the field energy for a short time is then available to be called up locally and does not necessarily require a costly grid connection of high power during the utilization experiment. The energy can be stored in the form of electrical energy (capacitors, battery), mechanical energy (rotor generator), or magnetic energy (magnetic materials).

Figure 3:
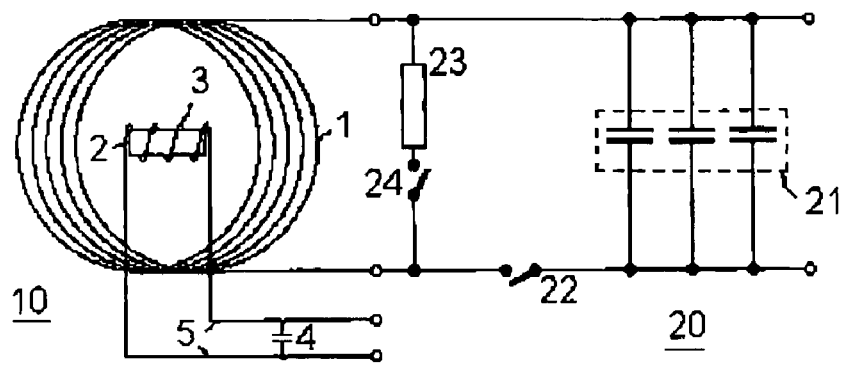
FIG. 3 illustrates schematically the measuring station as shown in FIG. 1 in conjunction with a device for generating a pulse-shaped main field.

FIG. 3 illustrates a current pulse generator 20 for operating the measuring station 10 according to the method in accordance with the invention. The generator 20 comprises an energy storage device, preferably a capacitive storage device in the form of a capacitor battery 21. The main field coil 1 can be connected to the energy storage device 21 via switch 22. When the switch 22 is open (i.e. non-conductive) the capacitor battery is charged from a supply source (not illustrated) and then, at a point in time t1, is electrically connected to the main field coil 1 by closing the switch 22. The capacitor battery 21 and the coil 1 now form a resonant circuit and the current in the coil commences an oscillation which is substantially sinusoidal.

Figure 4:
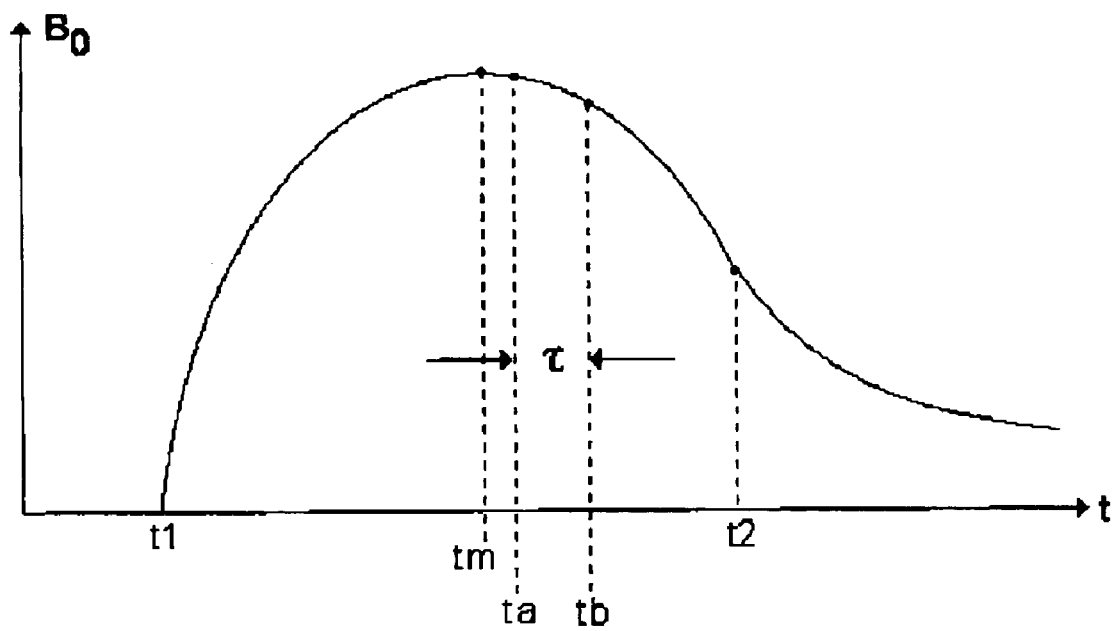
FIG. 4 illustrates the time curve of magnetic field strength where the measuring station is operated in accordance with the invention.

In a corresponding manner, the main field strength $B_0$ rises in a sinusoidal manner, as illustrated in the diagram of FIG. 4. At a point in time ta close to the maximum of the time function $B_0(t)$ of the main field, i.e. close to the peak of the $B_0$ pulse, the HF excitation pulse $\alpha$ is applied to the sample coil 3, so that an FID signal S(t) is induced in the sample coil (similar to that shown in diagram (b) of FIG. 2). During a measurement window $\tau$ the FID signal is scanned at a sampling frequency the level of which is selected according to the desired resolution. Digital Fourier transformation is used to determine the spectrum of the FID signal from the scanned values.

In FIG. 4 it is illustrated as an embodiment of the method that the point in time ta and the measurement window $\tau$ occur later than the point in time tm of the pulse maximum. In other embodiments ta can lie coincident with tm or even earlier and the measurement window $\tau$ can exceed the point in time tm or terminate prior to the point in time tm. The width $\tau$ of the measurement window $\tau$ is not illustrated in FIG. 4 to scale. This window can be extremely small with respect to the half value width of the main field pulse. The said half value width can lie in the order of magnitude of, for example, 10 to 1000 milliseconds, whereas the measurement window $\tau$, for example, can be approx. 10 micro-seconds to 100 milliseconds wide. The duration of the HF pulse can on the other hand be even shorter (e.g. approx. 0.1 to 10 micro-seconds).

At a point in time t2 which is after the end of the measurement window $\tau$ a parallel ohmic loss resistor 23 is preferably switched in by closing a further switch 24, so that the entire previously stored energy is not solely used in the coil 1 and does not excessively heat it. The switches' 22 and 24 are preferably optically controlled switching elements, such as for example, photothyristors. The point in time t2 and the resistance value of the loss resistor 23 are preferably selected such that the main field strength $B_0$ drops in an a periodic manner after the maximum, as illustrated in the diagram of FIG. 4. By suitably combining, for example, various capacitors in the energy storage device 20 or even an active control, the pulse form, i.e. the time function $B_0(t)$ of the main field pulse, can be influenced.

In an alternative embodiment, the switching in of a loss resistor can be delayed to such an extent (or omitted) to allow also the second half wave of the commenced sinusoidal oscillation to appear (or even more semi-waves), so that a second pulse of reverse polarity appears (or more pulses of alternating polarity). In this case, a measurement window can be defined at each pulse, preferably close to the respective peak value, in order to excite and measure several magnetic resonance signals one after the other.

The experiment can be performed successfully with a meaningful FID signal if the following parameters are sufficiently known:
(i) the range of γ-values (gyromagnetic ratios) over which the characteristics of the sample are to be analysed;
(ii) the time function $B_0(t)$ of the main field strength in the time window τ from the point in time ta of the HF pulse until the end tb of the detection of the FID signal.

If the main field strength $B_{0(ta)}$ is known at the point in time ta of the HF pulse α, the centre frequency $f_c$ of the HF pulse can be selected according to the above equation (2):

$$f_C = f_S = \gamma_S * B_{0(ta)},\qquad\text{Eq. (3)}$$

wherein $\gamma_s$ represents the average value of the γ range to be analysed. This range, unless known at the beginning, can be determined in a pre-experiment by means of a static main field of known and relatively low field strength, in that the sample is excited successively within various HF bands and the respective NMR spectrum is observed. Depending upon the width of the range to be analysed, it is also possible to establish the bandwidth of the HF excitation and of the FID measuring circuit.

In the case of the actual utilization experiment with pulsed main field strength the time change from $B_0(t)$ during the duration of the HF pulse does not play a noticeable role, provided the duration of the HF pulse is sufficiently short and/or occupies a time range in which the rise of the function $B_0(t)$ is minimal. The two prerequisites are relatively simple to fulfill, if the approximate temporal progression of $B_0(t)$ is known. An HF pulse length of approximately 0.5 µs which can be readily achieved even for 90° flip angles is mainly sufficient for the first condition. The second condition is fulfilled if the point in time ta is in the peak range of the main field pulse.

With respect to the detection of the FID signal S(t) the temporal change of the main field after the HF pulse is somewhat more critical. On the one hand, the frequency position of the FID spectrum shifts with the change in the main field. On the other hand, the FID signal must be measured over a specific minimum duration τ in order to be able to detect its spectrum in a sufficiently precise manner. Thus, the time-dependent shift during the measuring period can be considerable. This shift can only be properly taken into consideration during the analysis if its temporal progression is sufficiently defined, which requires a more precise determination of the time function $B_0(t)$ of the main field within the time window τ of the measurement.

A simple method of determining the time function $B_0(t)$ IS consists in directly measuring the main field strength in the measurement region by means of a calibration experiment using conventional field measuring devices. For this purpose, a series of measured values of the field strength can be recorded at least in the time range of the peak of the main field pulse, and a mathematical function can be defined which corresponds to the sequence of measured values or is very closely approximated thereto in order to suppress the noise of the measured values. A suitable function for this purpose is, for example, a sine function, since the main field pulse is the first branch of an attenuated sine-oscillation pulse. A likewise good approximation can be achieved by means of a parabolic function.

The process described above of defining the field progression $B_0(t)$ can be performed for a main field pulse of any specific peak amplitude. By means of multiplying by suitable measuring scale factors it is possible to determine the field progressions for pulses of different peak amplitudes. However, it is also possible to define a finite quantity of field progressions for pulses of different peak amplitudes in the manner described. In certain circumstances, however, it may be necessary to perform specific corrections by means of an additional re-calibration in order to avoid systematic errors. Such errors can occur if the characteristics of the measuring devices, which are used when defining the field progression and also during the NMR measurement, are not known precisely in all details at the beginning of the process, which is mainly the case.

In a particular embodiment of the invention, the recalibration is performed by means of a "calibration test piece" which comprises a nucleus type with a known gyromagnetic ratio. This calibration test piece is introduced into a static magnetic field whose strength $B_{01}$ approximately corresponds with the $B_0$ value, which the field progression definition $B_0(t)$ of a main field pulse demonstrates for a point in time tx which preferably lies close to the maximum of $B_0(t)$ or close to or within the time range of the measurement window τ which is to be used during the utilization experiments (tx can, for example, correspond to the point in time ta of the utilization experiment). Then, the suitable parameters for the NMR measurement of the said nucleus type (i.e. the centre frequency, bandwidth, amplitude and duration of the HF pulse and the duration of the measurement window) are searched out, using the same excitation and measuring system which is to be used for the utilization experiments. In the static field, this search does not constitute any problem. Subsequently, with the parameter setting as found and by use of the same system and the same calibration test piece, an experiment is performed in the pulsed main field for the point in time tx. In the event that a satisfactory NMR signal is detected, the previously performed definition of the field progression can be used. Otherwise further experiments are performed, wherein the point in time tx is changed until a satisfactory NMR signal is detected. The range across which this search must be performed is fairly small, so that the search is not very lengthy. Once the search has been successfully completed, it is known that precisely the field strength $B_{01}$ is present at the changed point in time tx'. By use of this precise information the field progression definition can be corrected, for example, by means of multiplying with a measuring scale factor which corresponds to the ratio between the value $B_{01}$ and the value demonstrated by the previous field progression definition for the point in time tx'.

During the mentioned search for a satisfactory NMR signal in the pulsed main field it is possible to vary the centre frequency $f_c$ or the energy E of the HF pulse alternatively or additionally instead of varying the point in time tx. From the value $f_c'$ or the value E', at which the satisfactory NMR signal is detected, the precise strength-of the main field for the point in time ta can be calculated in order to be able to correct the field progression definition accordingly.

The above described recalibration is suitable for pulsed main fields up to a field strength which can be achieved using static magnets. A simple extrapolation of the curve progression obtained for pulsed main fields to high field strengths (up to 60 T) is not possible as the precise progression of the main field depends upon the energy used (in particular the position tm of the maximum value also shifts). An additional difficulty occurs when extremely high frequencies are to be observed: the higher the field strength, the smaller the relative bandwidth (absolute bandwidth divided by the centre frequency) of the NMR. With higher field strengths, owing to the increasingly narrower relative bandwidth of the NMR, the said deviations make it increasingly more uncertain that the NMR will actually be found, if ta and $f_s$ are set using an extrapolated function $B_0(t)$. In order to make it easier to find the resonance, a nucleus type with a small gyromagnetic ratio may be used for the calibration test piece, so that even at high field strength values the resonance frequency itself is low and thus the relative bandwidth is large.

In order to solve this problem, in a different embodiment of the invention, a substance can be used as the calibration test piece, which substance comprises two nucleus types with extremely different gyromagnetic ratios, i.e. a first nucleus type with a high gyromagnetic ratio $\gamma_1$ and a second nucleus type with a low gyromagnetic ratio $\gamma_2$. Using such a calibration test piece in a static magnetic field which has a small field strength $B_{01}$ a search is first performed for the parameter settings for an NMR detection of the $\gamma_1$ nucleus type, similar to that of the recalibration described earlier. Subsequently, using the same calibration test piece and using the same excitation and measuring system, an experiment is performed in the pulsed main field for the point in time tx, where the hitherto field progression definition demonstrates a field strength $B_{02}=(\gamma_1/\gamma_2) B_{01}$. In so doing, the previously established parameter settings are used, excepting the amplitude of the HF pulse which is increased according to the ratio $(\gamma_1/\gamma_2)$. In the event that a satisfactory NMR signal is detected, the previously performed definition of the field progression can be used. Otherwise, further experiments are performed, wherein the point in time tx is changed until a satisfactory NMR signal is detected. As the range across which this search must be performed is fairly small, the search is not very lengthy. Once the search is successful, it is known that at the changed point in time tx' there is precisely the field strength $B_{02}$ existing. This precise information can be used to correct the field progression definition, for example, by multiplying by a measuring scale factor which corresponds to the ratio between the value $B_{02}$ and that value which the previous field progression definition demonstrated for the point in time tx'. The accuracy of the recalibration performed in this manner is determined by the precise knowledge of $(\gamma_1/\gamma_2)$.

Also in this recalibration method, it is possible to vary the centre frequency or the energy of the HF pulse, as an alternative or in addition to varying the point in time tx, in order to search for the NMR signal in the pulsed main field.

Since the precision of $(\gamma_1/\gamma_2)$ is influenced by the electronic environment of the $\gamma_1$ nucleus type and the $\gamma_2$ nucleus type (so-called shift) it is recommended to use isotopes (elements with differing nucleus structure). The electronic or chemical characteristics of isotopes are to a great extent identical and the ratio of the effective gyromagnetic ratios is hardly influenced by shifts. One sample substance which is suitable and is to be used in preference for this calibration experiment is a mixture of heavy water (hydrogen isotope Deuterium D) and light water (hydrogen isotope H) to which is added a soluble salt (e.g., $GdBr_3$) which shortens the process of relaxing the nuclei and promotes the rapid upwards polarization of the nuclei in the pulsed main field. Since the ratio $\gamma_1(^1H)/\gamma_2(^2D)$ is known precisely, (approx. 6.5), it is possible in weak fields $B_{01}$ (static or pulsed) to observe the $^1H$ resonance; owing to the large bandwidth it can be detected in a convenient manner where appropriate. Subsequently, only the amplitude of the HF pulse is altered, and the resonance of $^2D$ now occurs at $B_{02}=B_{01}*\gamma_1(^1H)/\gamma_2(^2D)$.

The method described above is in principle a field measurement process using NMR. Such a principle for the precise measurement of the highest magnetic fields is hitherto, also per se, absolutely new and there is no example of it in the prior art.

After successful calibration and storage of the field progression definitions $B_0(t)$ for a set of different maximum field strengths for a well-defined pulse field system (main coil and energy storage device) it is possible to determine the field progression, which is expected to be close to the maximum, even from a short time period in the rising phase of $B_0$. For this purpose the field progression is measured at still relatively low field strengths between two points in time before tm and, using a fast calculator, is compared with the stored field progressions, and the particular stored field progression which is the closest to the measured field progression is sought out. It is also possible to describe the stored field progressions analytically and to calculate $B_0$ quickly just before achieving the maximum. This information can be used to control the HF pulse and the detection process. Thus, it is not necessary to repeat the field calibration for each experiment.

As described above, contrary to expectations, it is thus possible to determine all the necessary parameters in order to detect a meaningful FID signal using a pulsed main field of high field strength. Since the time function $B_0(t)$ of the field which leads to an additional frequency modulation of this signal can also be determined in the described manner with sufficient precision, all the necessary prerequisites for a clear analysis of the NMR are fulfilled.

The spectral resolution is reduced by the frequency modulation since the NMR signal is thereby distributed over a frequency range which is established by changing the main field during the observation process. This effect can be compensated in a relatively simple manner during or after detection of the FID signal S(t). It is possible to calculate the modulation function f(t) sufficiently precisely from the function $B_0(t)$ according to the following formula:

$$f(t)=\gamma_s*B_0(t), \quad \text{Eq. (5)}$$

A first compensation option is to add a frequency modulator to the measuring circuit connected to the sample coil which frequency modulates the signal S(t) inversely to f(t). Since such a modulation process impairs the signal-noise ratio, a new method is introduced: when deriving the spectrum from the time signal S(t) a time-dependent Fourier transformation is performed according to the following formula:

$$\int_0^\infty \langle S(t)*\exp[-j\omega(t)t]\rangle\, dt, \quad \text{Eq. (6)}$$

wherein j is equal to $\sqrt{-1}$ and $\omega(t)$ is equal to $2\pi*f(t)$ or $2\pi*[F-f(t)]$, if F is the carrier frequency used to convert the frequency of the FID signal. However, both methods are working only on condition that the temporal change $B_0(t)$ is slow in comparison to the NMR frequency $f_s$, the closer the measurement window lies to the peak of the field pulse, the better this requirement is fulfilled.

Figure 5:
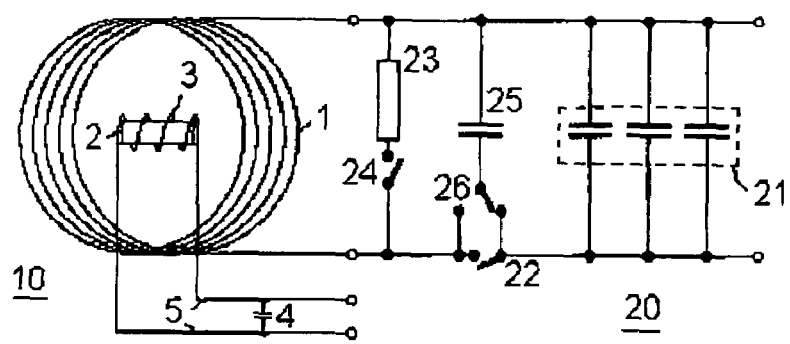
FIG. 5 illustrates an exemplified embodiment of a device for generating a main field pulse which contains a pre-polarising part.
Figure 6:
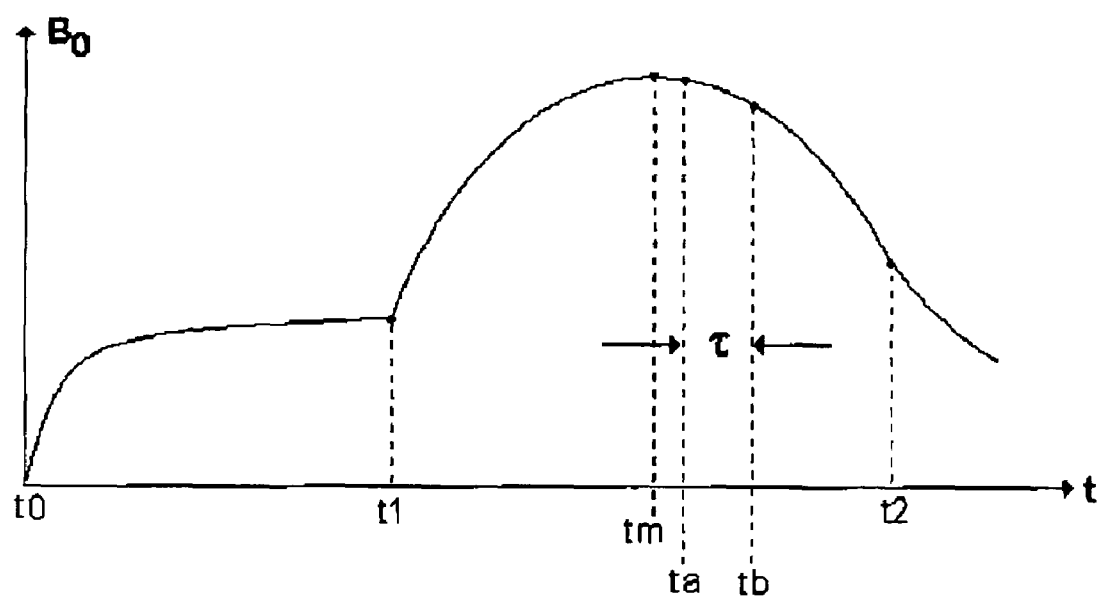
FIG. 6 illustrates the form of the magnetic field pulse generated using the device as shown in FIG. 5.

Problems can arise when examining materials with a slow nuclear relaxation if the generated pulse of the main field rises suddenly and is narrow. In this case, the spins are namely not fully upwards polarized during the short phase in which the field is rising and this results in a loss in intensity. It can be of help to pre-polarize the spins with a weaker, but longer lasting, main field pulse prior to triggering the strong pulse. FIG. 5 illustrates an exemplified embodiment of a device for generating a main field pulse which comprises a pre-polarizing part. FIG. 6 illustrates the pulse form generated using this device.

The device illustrated in FIG. 5 differs from the device as shown in FIG. 3 in that during the charging process an additional energy storage device-capacitor (or a battery of additional capacitors) 25 is connected in parallel to the capacitor battery 21 via a switch 26. Once the entire capacitor system 21, 25 has been charged, the switch 26 is first set at the point in time t0 such that the capacitor 25 discharges via the coil 1 and a pulse of the main field strength $B_0$, being relatively flat at the beginning, is generated. Approximately at the maximum of this pre-pulse the switch 22 is closed at the point in time t1 and the scenario described with reference to FIG. 3 is continued so that the strong main field pulse, as already demonstrated in FIG. 4, follows on, possibly with a somewhat increased amplitude, which can even be advantageous. Instead of the additional capacitor 25 it is also possible to use a different energy source if desired, for example, a direct current battery or a mains-fed direct current source which at the point in time t0 is connected to the main field coil 1 and is decoupled at the point in time t1 or later.

The method in accordance with the invention was described above in conjunction with an HF excitation mode, in which an extremely short HF pulse is applied practically simultaneously with the point in time ta at which the measurement window τ commences. In order to provide sufficient energy for a measurable transverse magnetisation, this pulse must have a high power. One alternative, which can be used in an advantageous embodiment, is to apply the exciting HF oscillation as an "elongated" pulse over a longer period of time and with a weak power, in that the oscillation commences at a specific period of time Δt prior to the point in time ta, i.e. before the main field pulse reaches the field strength at which the oscillation starts to resonate with the spin type to be analysed. This elongated HF pulse must then be switched off shortly after reaching the resonance at the point in time ta in order to be able to detect the FID signal (so-called field sweep). The switch-on time ta−Δt must be tailored to suit the power of the HF pulse and the temporal change of the function $B_0(t)$ in such a manner that at the switch-on time ta a flip angle is existent which leads to a measurable transverse magnetisation. This can, however, be established by experiment or mathematically.

Figure 7:
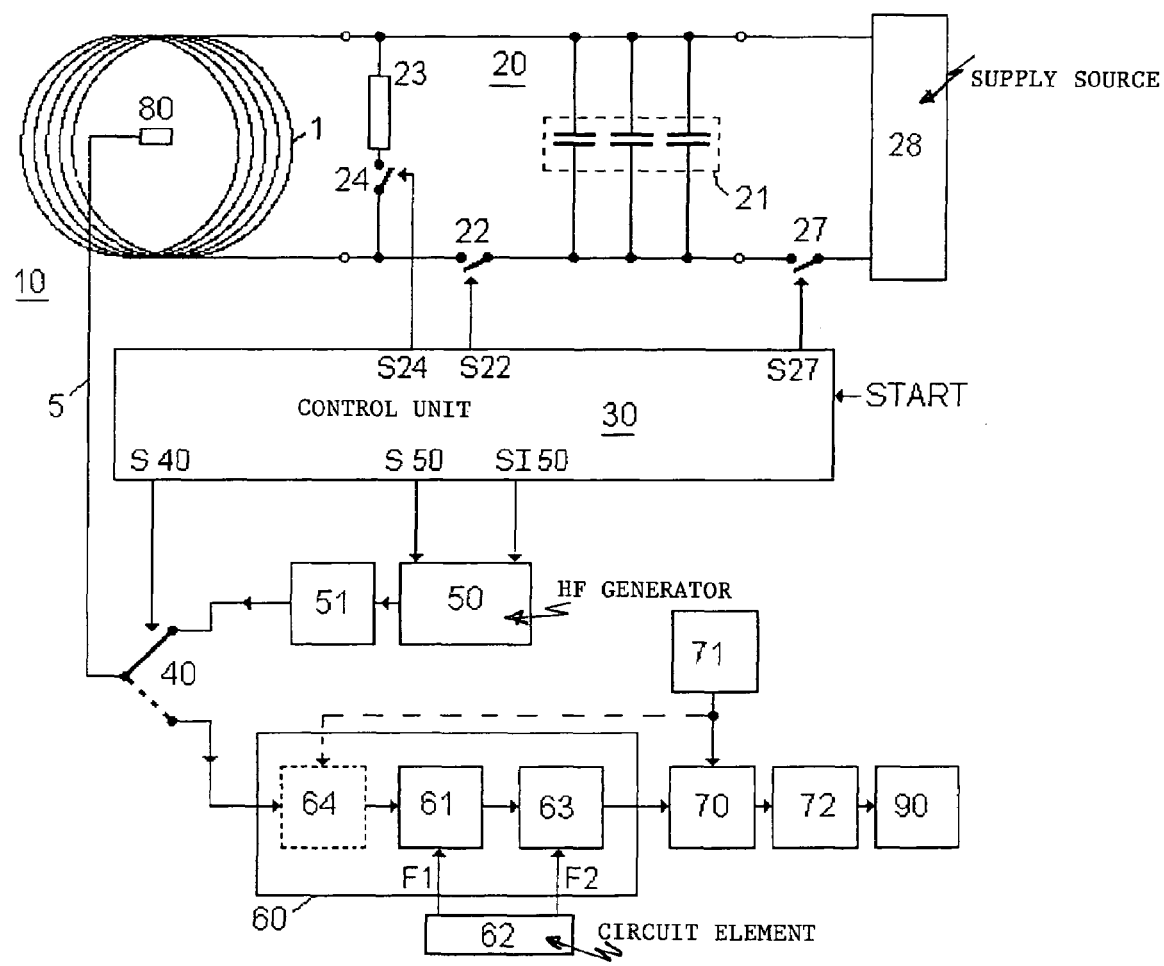
FIG. 7 illustrates a block diagram of the structure of an entire system for performing NMR spectroscopy in accordance with the invention.

FIG. 7 illustrates, partially in block form, the structure of an entire system, including the control device, for performing NMR spectroscopy in accordance with the invention. For the sake of simplicity, in FIG. 7 the connections between the blocks are represented as simple lines, even if in practice there may be mainly two-wire or multi-wire connections or other types of transmission paths (e.g. optical).

According to FIG. 7, the current pulse generator 20, which is connected to the main field coil 1 of the measuring station 10 and in the illustrated case has the structure shown in FIG. 3, can be connected via a switch 27 to an electrical supply source 28 which can provide the current to charge the capacitor battery 21. The switches 22 and 24 within the generator 20 can be actuated by means of control signals S22 and S24 which are supplied by a control unit 30.

Figure 8:
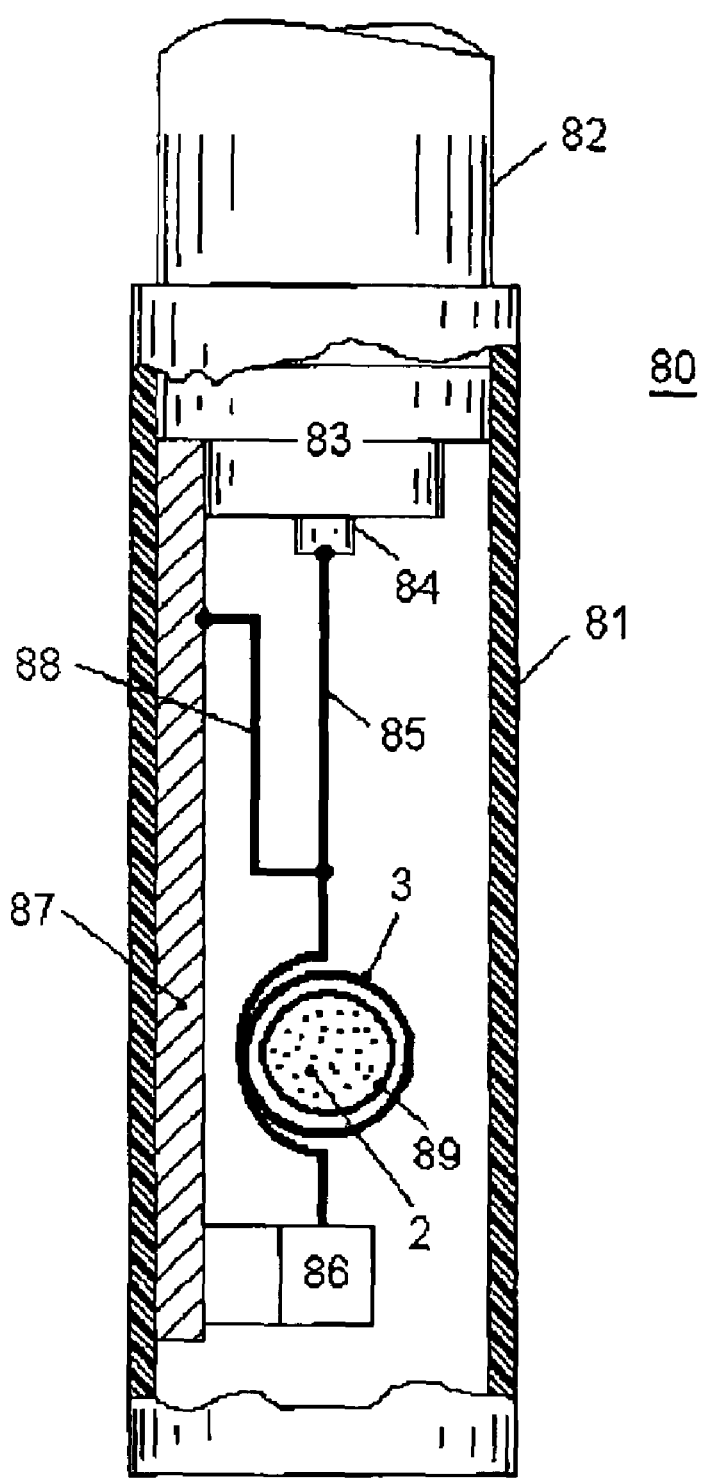
FIG. 8 illustrates an advantageous embodiment of a sample head for performing NMR spectroscopy in accordance with the invention.

The equipment which is to be arranged within the main field coil 1 and which comprises the sample and the sample coil and which is illustrated in FIG. 8 as a block 80 and is described hereinunder as the "sample head" is connected via the supply line 5 to a switch 40 which can be switched by a control signal S40, which is supplied by-the control unit 30, between two switching states in order to connect the sample head 80 optionally to the output-side power amplifier 51 of an HF generator 50 or to a detection device 60. The switch 40 is represented symbolically in FIG. 7 as a mechanical switch, in reality it is naturally an electronic switching device with a short response time.

The characteristics (oscillation frequency, bandwidth and envelope curve) of the HF pulse generated by the HF generator 50 can be adjusted preferably by means of adjustment information SI60 provided by the control unit 30, wherein the adjustment of the oscillation frequency, for example, via a frequency synthesizer can be performed in the HF generator. The HF pulse is triggered by means of a trigger signal S50 which is provided by the control unit 30.

The detection device 60 comprises preferably a frequency converter 61 which receives a stable carrier frequency F1 from a circuit element 62 in order to convert the high frequency FID signal from the sample head 80 into a lower frequency band. The output of the converter 61 leads to a scanner 63 in order to sample the converted FID signal with a desired sampling frequency F2 which is also provided by the circuit element 62. The sampled values are applied to a down-stream Fourier calculator 70 which provides the spectral information of the sampled FID signal by means of Fourier transformation. The Fourier calculator 70 is preferably designed in such a manner that it performs a time-dependent Fourier transformation according to the time function $B_0(t)$ which has been recorded according to one of the above described calibration methods and stored in a function storage device 71. A data storage device 72 stores the spectral information provided by the Fourier calculator 70 which can then be displayed graphically at an output device 90 (oscilloscope or printer).

Optionally, a frequency modulator 64 can be added before the frequency converter 61 (or between the frequency converter 61 and the scanner 63), which frequency modulator uses the function $B_0(t)$ stored in the function storage device after its inversion as a modulation signal for a frequency modulation of the FID signal. In this case, the Fourier calculator 70 must be designed such that it performs a normal (i.e. a time-independent) Fourier transformation.

In order to perform a utilization experiment the control unit 30 is initially programmed to program the time sequence of the mentioned control signals and the characteristics of the HF pulse. The switch 40 is initially held in the state indicated by the bold line in which it connects the sample head 80 to the output of the amplifier 51 of the HF generator 50. The points in time to be specified by the control unit 30 are: t1 to close the switch 22 in the current pulse generator 20 (control signal S22); ta (or ta−Δt in the event of an "elongated" pulse) to trigger the HF pulse at the HF generator 50 (control signal S50); tb=ta+τ to switch the switch 40 to the analyser 60 (control signal S40); t2 to close the switch 24 in the current pulse generator 20 (control signal S24).

After this programming process (or even prior thereto) the supply switch 27 on the current pulse generator 20 is closed and the sample to be examined is introduced into the measurement region of the main field coil 1. When the energy storage device 21 is charged, the supply switch 27 is opened again and the start command START is applied to the control unit 30. The experiment then runs automatically under the control of the mentioned switches by means of the control unit 30 according to the programmed time sequence.

The calibration experiments described earlier can naturally also be performed using the system shown in FIG. 7, wherein the Fourier transformation in the Fourier calculator 70 is however to be performed in a time-independent manner and also the frequency modulation of the FID signal should be omitted.

Using the described measures and devices in accordance with the invention it is now possible for the first time to observe NMR in pulsed magnets. NMR signals at fields up to 60 T were recorded (the hitherto highest fields were approx. 40 T). The intensity and resolution achieved demonstrate that the technique in accordance with the invention is very promising; "new doors" leading to structure research in high fields have been flung open.

The high field NMR is, however, not the sole area of application of the invention. It is not only in extreme field strengths that NMR in pulsed fields can be used as an advantageous alternative to the NMR in static fields. The invention also opens up the possibility to observe NMR using main field magnets which are much smaller than the hitherto required magnets. Even in small magnets it is possible, if they are operated according to the invention in a pulsed manner, to achieve relatively strong fields (5-30 T), using a small amount of energy (low heat development). Such magnets require hardly any cooling, are light and transportable and hardly require any maintenance—in contrast to the widely used superconductive magnets. The possibility therefore arises to make NMR systems with pulsed fields into a reasonably priced mass-produced article which can be used as a routine tool, for example in doctor's practices or even in private households. The calibration can be performed by the manufacturer according to the methods described above, tailored to suit the respective application (for analysing spin types). The respective control devices for adjusting among other things the frequency, the flip angle and the time of the HF excitation pulses and the measurement window can be fixedly programmed by the manufacturer. As an alternative, different programs can also be offered to the user for different applications in the form of software for installation in the control device.

Generally, but especially in spatially small main field coils, it is recommended to incorporate special structural measures with respect to the structure of those components which are to be arranged within the main field coil. This relates on the one hand to the vessel or the holder for the sample and on the other hand to the sample coil. The measurement region which can be utilised in the main field coil, i.e. the region of homogenous field strength in the centre of the coil, is namely only a relatively small part of the coil volume. In particular, if this volume itself is small, the dimensions of the said components must be limited accordingly. In a particular embodiment of the invention these components are combined in an inherently rigid and compact "sample head" which can also have the desired small dimensions.

The sample head should have maximum sensitivity in order to guarantee the highest possible signal-noise ratio. This requires a high fill factor, i.e. the greatest possible part of the resonant energy must be located in the sample. This calls for matching the sample coil to the supply line in immediate proximity of the connection of the line to the sample coil. In view of problems with space and in view of the expected eddy currents, wire loops and elements which need tuning and which could trap the flux of the pulse field should be dispensed with as far as possible. FIG. 8 illustrates, partially in the cross-sectional view an exemplified embodiment of a sample head 80 which fulfills these requirements.

According to FIG. 8, an SMC plug-in connector 83 is provided at the end of a coaxial HF line 82 which forms the supply line 5 of the measuring station 10 as shown in FIG. 3, the inner conductor 84 thereof being connected to one end of the sample coil 3 via a short line piece 85 made from a highly conductive and non-magnetic material (copper or gold). The sample coil 3 closely encompasses a vessel 89, for example, a glass tube, in which the sample 2 with the material to be examined is located, for example in a solution. The other end of the sample coil 3 leads via a further short line piece to one side of an electrical capacitance 86, preferably a ceramic capacitor, whose other side is fixedly connected to a tongue 87 which is as rigid as IS possible and is made from a highly conductive, non-magnetic material (preferably brass). The tongue 87 is rigidly attached to the outer conductor of the plug-in connector 83. An inductivity element 88 is connected in parallel with the series circuit element of coil 3 and capacitor 88, in order to form together with the capacitor 83 a tuned circuit for the HF antenna formed by the sample coil 3.

The inductivity element 88 in the example illustrated in FIG. 8 is a small wire piece whose one end is connected to the connection line 85 between the plug-in connector inner conductor 84 and the sample coil 3 and whose other end is attached to the tongue 87. The main length of the inductivity wire piece 83 should extend as far as possible in that direction which is parallel with the direction of the main magnetic field $B_0$ if the sample head 80 sits within the main field coil. This minimises an undesired inductive coupling of the main field pulse in the tuned circuit of the sample coil 3.

In preference, a sheathing 81 (for example a shrink-tube) is placed over the end of the HF line 82 (or the plug-in connector 83), this sheathing encompasses all parts of the sample head 80 in a protective manner and consists of a material which does not shield the inner parts of the sample head from the main field. Prior to being introduced into the measuring station the sample head 80 can be adapted and matched during the course of its assembly to suit the nucleus type to be examined in the sample material and also to suit the main field strength to be used, by dimensioning the inductivity $L_3$ of the sample coil 3, the capacitance $C_{86}$ of the capacitor 86 and the inductivity $L_{88}$ of the wire piece 88. Naturally, when adapting/matching the sample head 80 accordingly the reactances of the supply line system must also be taken into consideration. In contrast to the conventional NMR, only the precise adaptation, not the precise matching as well, is of greater importance as it is possible with the pulse field to match the frequency of the nuclear magnetic resonance with the natural frequency of the oscillation circuit.

A manufacturer can manufacture sample heads 80 adapted in each case for different application conditions and supply them to the user. The cheap and compact construction of the sample head can even make economical to deliver such heads as disposable products, which are filled by the user with the sample material and can be sealed by shrinking the tube 81 and can be disposed of after the experiment. It is likewise feasible to modify the sample head by inserting the coil into a small tube which contains the liquid to be examined.

Special reference has been made in the above description to the case that the FID signal is detected as a magnetic resonance signal. However, it is also possible to generate spin echoes as magnetic resonance signals, by means of one or several further HF pulses in a manner known per se, and to detect them in one or several suitably scheduled measuring windows. It is also possible to perform a pretreatment process prior to the actual process of measuring the NMR signal in order to influence the spin system in a purposeful manner, for example, by means of suitably dimensioned HF pulses in order especially to weight the specific attributes of the spin system in the measuring result. Moreover, it may be noted that during the course of one of several sequential main field pulses several excitation and measuring cycles can be performed in order to detect several NMR signals. All these variants fall within the scope of the invention.

As already mentioned in the introduction, the preferred area of application of the invention is the measuring of nuclear spin resonance NMR. The invention has therefore been explained in conjunction with NMR. The principles described can, however, also be used to measure the electron spin resonance (ESR) which also falls within the scope of the invention.

The invention claimed is:

1. Method for examining a sample by means of magnetic resonance spectroscopy including the execution of a utilization experiment comprising the following steps:
    a spatially substantially homogenous main magnetic field is generated in a measurement region containing the volume of the sample using a main field coil which encompasses the measurement region, which main field aligns the atomic spins of the sample longitudinally with respect to the field lines, wherein said main magnetic field has a time-dependent progression and has an amplitude progression in the form of at least one pulse which follows a defined time function within a defined time window;
    from a point in time before or at the commencement of the defined window of time the sample is subjected to a high frequency electromagnetic excitation pulse whose frequency band, amplitude and duration are selected such that within the time window a magnetic resonance signal appears;
    the temporal progression of the magnetic resonance signal is measured and its spectrum is analysed.

2. Method as claimed in claim 1, wherein the pulse of the main magnetic field is generated using an air core coil of resistive conductor material and an energy storage device which is charged before the experiment and then connected to the main field coil in order to generate in the coil a current which produces the main field pulse.

3. Method as claimed in claim 2, wherein a capacitive energy storage device is used as the energy storage device.

4. Method as claimed in claim 2, wherein at a point in time after the process of measuring the magnetic resonance signal an ohmic shunting resistor is connected in parallel with the main field coil, in such a manner that the strength of the main field dies away aperiodically from this point in time.

5. Method as claimed in claim 1, wherein the defined time function is determined by means of a series of calibration experiments which are performed prior to the utilization experiment and wherein the strength of the main field is measured at different points in time along the time axis of the respectively generated main field pulse.

6. Method as claimed in claim 5, wherein a recalibration of the determined time function is performed by the following steps:
    a calibration test piece which comprises a spin type with a known gyromagnetic ratio is subjected to a constant main field with a known field strength and the operating parameters for obtaining a satisfactory magnetic resonance signal from the known spin type are sought;
    subsequently experiments using the calibration test piece are performed in a pulsed main field for which the time function has been determined, wherein, by manipulation of at least one of the operating parameters found at a constant main field, the point on the field progression is sought at which a satisfactory magnetic resonance signal is generated from the known spin type;
    in the event that the point found deviates from the determined time function, the determined time function is amended in the sense of a correction of the deviation.

7. Method as claimed in claim 5, wherein a recalibration of the determined time function is performed by the following steps:
    a calibration test piece which comprises a first spin type with a large gyromagnetic ratio $\gamma_1$ and a second spin type with a small gyromagnetic ratio $\gamma_2$ is subjected to a constant main field with a known field strength, and the operating parameters for obtaining a satisfactory magnetic resonance signal from the first spin type are sought;
    subsequently experiments using the calibration test piece are performed in a pulsed main field for which the time function has been determined, wherein the amplitude of the excitation pulse is increased according to the quotient $\gamma_1/\gamma_2$ and by further manipulation of the increased amplitude and/or of another of the operating parameters found at a constant main field, the point on the field progression is sought at which a satisfactory magnetic resonance signal is generated from the second spin type;
    in the event that the point found deviates from the determined time function, the determined time function is amended in the sense of a correction of the deviation.

8. Method as claimed in claim 7, wherein the two spin types are isotopes of the same chemical element.

9. Method as claimed in claim 8, wherein the first spin type is normal hydrogen $^1$H and the second spin type is heavy hydrogen $^2$D.

10. Method as claimed in claim 1, wherein the measured magnetic resonance signal is frequency modulated inverse to the defined time function.

11. Method as claimed in claim 1, wherein the defined time window is positioned close to the maximum or in the region of the maximum of the main field pulse.

12. Method as claimed in claim 11, wherein the spectrum of the magnetic resonance signal is calculated by means of a time-dependent Fourier transformation according to the said defined time function.

13. Method as claimed in claim 1, wherein the rising portion of the main field pulse has a temporal progression which allows spins which are relaxing slowly sufficient time to become fully polarised until the point in time of the pulse maximum.

14. Method as claimed in claim 13, wherein the main field pulse is generated in the form of two successive steps, the first of which pre-polarizes the spins and has lower amplitude than the second step in which lies the defined time window.

15. Method as claimed in claim 14, wherein the first step of the main field pulse is generated by connecting a separate energy source to the main field coil and wherein the second step is generated by discharging the energy storage device across the main field coil.

16. Method as claimed in claim 1,
wherein prior to performing utilization experiments the time functions for several main field pulses of differing peak amplitudes are determined and stored,
and wherein during the performance of a utilization experiment the temporal progression of the main field is measured before the excitation pulse is generated,
and wherein by comparing the measurement result with the stored time functions prior to generating the excitation pulse, the stored time function which is closest to the measurement result is selected as the defined time function for the utilization experiment.

17. Apparatus for examining a sample by means of magnetic resonance spectroscopy comprising:
a main field coil for generating a spatially substantially homogenous main magnetic field in a measurement region;
a sample holder for holding the sample in the measurement region;
a current pulse generator for operating the main field coil by a current pulse in order to generate in the measurement region at least one main field pulse which can align atomic spins of the held sample longitudinally with respect to the field lines and which follows a defined time function within a defined time window;
a sample coil encompassing the site of the sample;
an HF generator for influencing the sample coil with an electromagnetic HF oscillation pulse whose frequency band, amplitude and duration are adjustable to such an extent that within the defined time window a magnetic resonance signal from the sample is induced in the sample coil;
a detection device for detecting the induced magnetic resonance signal;
a control device, which can be programmed to trigger the current pulse, to trigger the HF pulse and to connect the detection device to the sample coil for the duration of the defined time window.

18. Apparatus as claimed in claim 17, wherein the main field coil is an air core coil comprising a resistive conductor material.

19. Apparatus as claimed in claim 17, wherein the current pulse generator comprises an energy storage device which can be connected, after it is charged, to the main field coil in order to allow a current, which produces the main field pulse, to flow in the main field coil.

20. Apparatus as claimed in claim 19, wherein the energy storage device is a capacitive energy storage device.

21. Apparatus as claimed in claim 19, wherein a shunting resistor is arranged in parallel with the main field coil in series with a switch.

22. Apparatus as claimed in claim 17, further comprising a Fourier calculator for performing a Fourier transformation of the detected magnetic resonance signal.

23. Apparatus as claimed in claim 22, wherein the Fourier calculator is designed in such a manner that the Fourier transformation is performed in a time-dependent manner according to the defined time function.

24. Apparatus as claimed in claim 17, further comprising:
a frequency modulator for performing frequency modulation of the detected magnetic resonance signal inversely with respect to the defined time function
and a Fourier calculator for performing the Fourier transformation of the frequency modulated magnetic resonance signal.

25. Apparatus as claimed in claim 17, wherein the defined time window lies close to the maximum or in the range of the maximum of the main field pulse.

26. Apparatus as claimed in claim 17, wherein the current pulse generator is designed to generate the main field pulse with a temporal progression which allows spins which are relaxing slowly sufficient time to become fully polarized until the point in time of the pulse maximum.

27. Apparatus as claimed in claim 26, wherein the current pulse generator is designed to generate the main field pulse in the form of two sequential steps, the first of which pre-polarizes the spins and has a lower amplitude than the second step in which the defined time window lies.

28. Apparatus as claimed in claim 27, wherein the current pulse generator comprises a separate energy source to generate the first step of the main field pulse.

29. Sample head which is tailored for use in an apparatus as claimed in claim 17, in that it comprises the sample coil which is rigidly connected mechanically to a vessel for receiving the sample and rigidly connected mechanically to an electric connector for connection to an HF supply line.

30. Sample head as claimed in claim 29, further comprising a capacitor and an inductivity element which form together with the sample coil a resonance circuit with a preselected resonance frequency.

31. Sample head as claimed in claim 30, wherein the resonance frequency and the quality factor of the resonance circuit formed are set in such a manner that the magnetic resonance to be analysed of the sample to be used at main field strengths, which occur within the defined time window, lies within the resonance bandwidth of the said resonance circuit.

32. Sample head as claimed in claim 29 with a sheathing which encompasses all parts of the sample head.

* * * * *